United States Patent
Ishii et al.

(10) Patent No.: US 7,395,779 B2
(45) Date of Patent: Jul. 8, 2008

(54) PLASMA PROCESSING APPARATUS

(75) Inventors: Nobuo Ishii, Hyogo (JP); Kibatsu Shinohara, Kanagawa (JP); Yasuyoshi Yasaka, Kyoto (JP)

(73) Assignee: Tokyo Electron Limited, Tokyo (JP)

( * ) Notice: Subject to any disclaimer, the term of this patent is extended or adjusted under 35 U.S.C. 154(b) by 195 days.

(21) Appl. No.: 10/332,499

(22) PCT Filed: Jul. 11, 2001

(86) PCT No.: PCT/JP01/06004

§ 371 (c)(1),
(2), (4) Date: Jan. 10, 2003

(87) PCT Pub. No.: WO02/05339

PCT Pub. Date: Jan. 17, 2002

(65) Prior Publication Data
US 2003/0173030 A1    Sep. 18, 2003

(30) Foreign Application Priority Data
Jul. 11, 2000   (JP) .................. 2000-209590
Jan. 18, 2001   (JP) .................. 2001-010780

(51) Int. Cl.
  *C23C 16/00*   (2006.01)
  *C23F 1/00*    (2006.01)
  *H01L 21/306*  (2006.01)
(52) U.S. Cl. .................. 118/723 MW; 156/345.41
(58) Field of Classification Search ........... 156/345.41, 156/345.42; 118/723 MW, 723 MA
See application file for complete search history.

(56) References Cited

U.S. PATENT DOCUMENTS

| 4,721,553 | A | * | 1/1988 | Saito et al. ............. 204/192.12 |
| 4,831,963 | A | * | 5/1989 | Saito et al. ........... 118/723 MR |
| 5,034,086 | A | * | 7/1991 | Sato ...................... 156/345.42 |
| 5,342,472 | A | * | 8/1994 | Imahashi et al. ....... 156/345.42 |

(Continued)

FOREIGN PATENT DOCUMENTS

JP    2-174223    7/1990

(Continued)

OTHER PUBLICATIONS

English Machine Translation of JP 09-181046. Obtained from http://www4.ipdl.inpit.go.jp/cgi-bin/tran_web_cgi_ejje on Jun. 10, 2007.*

(Continued)

*Primary Examiner*—Parviz Hassanzadeh
*Assistant Examiner*—Maureen G Arancibia
(74) *Attorney, Agent, or Firm*—Finnegan, Henderson, Farabow, Garrett & Dunner, LLP

(57) ABSTRACT

A first conductive plate (31A) constituting the radiation surface of a slot antenna (30A) inclines with respect to a first dielectric member (13) opposed to the radiation surface of the slot antenna (30A). Consequently, a plasma generated by the electric field of an electromagnetic field entering directly from the slot antenna (30A) can be set dominant over a plasma generated by the electric field of a standing wave formed in a processing vessel (11). Since the former can be controlled more easily than the latter, the plasma distribution can be improved.

17 Claims, 16 Drawing Sheets

U.S. PATENT DOCUMENTS

| | | | | |
|---|---|---|---|---|
| 5,646,489 A | * | 7/1997 | Kakehi et al. | 315/111.21 |
| 6,059,922 A | * | 5/2000 | Yamazaki et al. | 156/345.37 |
| 6,150,763 A | * | 11/2000 | Leou et al. | 315/111.51 |
| 6,622,650 B2 | * | 9/2003 | Ishii et al. | 118/723 MW |
| 6,929,830 B2 | * | 8/2005 | Tei et al. | 427/575 |
| 2002/0011215 A1 | | 1/2002 | Tei et al. | |
| 2003/0203125 A1 | | 10/2003 | Tei et al. | |

FOREIGN PATENT DOCUMENTS

| | | |
|---|---|---|
| JP | 6-188237 | 7/1994 |
| JP | 9-162178 | 6/1997 |
| JP | 9-181046 | 7/1997 |
| JP | 11-67725 | 3/1999 |
| JP | 11-172446 | 6/1999 |
| JP | 11-172447 | 6/1999 |
| JP | 11-176593 | 7/1999 |
| JP | 2000-294548 | 10/2000 |
| JP | 2000294548 A * | 10/2000 |
| JP | 2001-167900 | 6/2001 |
| WO | WO98/33362 | 7/1998 |

OTHER PUBLICATIONS

International Preliminary Examination Report (Translation).
International Search Report in EP 01 94 9933 dated Aug. 11, 2005.
International Preliminary Examination Report (Translation), May 7, 2002.

* cited by examiner

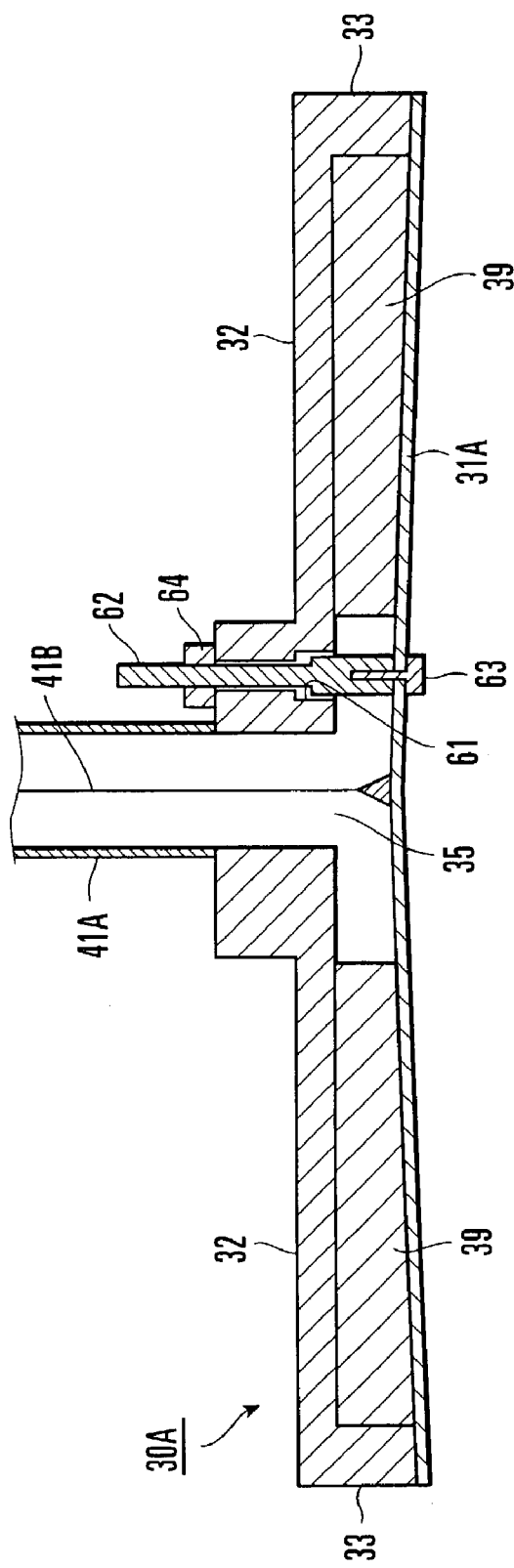

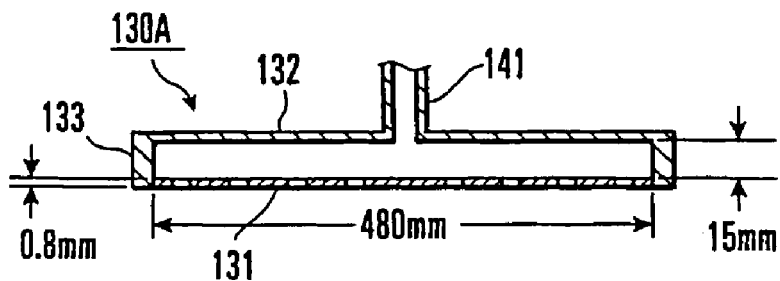
PRIOR ART  FIG.4A
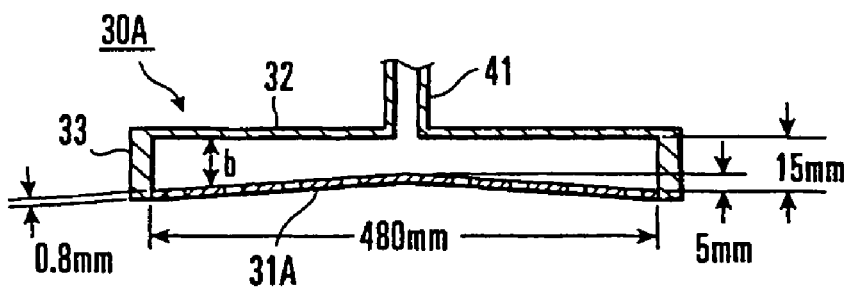
FIG.4B
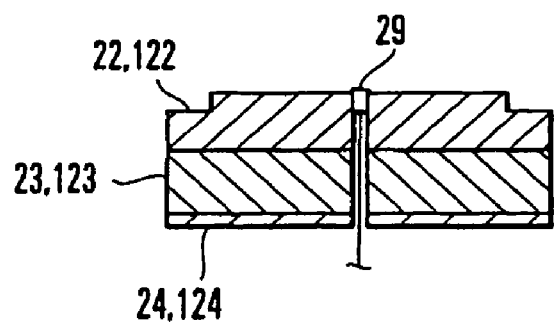
FIG.4C

PLASMA PROCESSING APPARATUS

BACKGROUND OF THE INVENTION

The present invention relates to a plasma processing apparatus which performs a predetermined process by generating a plasma with an RF electromagnetic field.

In the manufacture of a semiconductor device, plasma processing apparatuses are used often to perform processes such as formation of an oxide film, crystal growth of a semiconductor layer, etching, and ashing. Among the plasma processing apparatuses, an RF plasma processing apparatus is available which can stably generate a plasma even under a comparatively low pressure. The RF plasma processing apparatus generates a high-density plasma by introducing an RF electromagnetic field into a processing vessel through a planar antenna.

A case wherein the RF plasma processing apparatus is applied to an etching apparatus will be described. FIG. 20 is a view showing the arrangement of an etching apparatus using a conventional RF plasma processing apparatus. FIG. 20 shows the sectional structure of part of the arrangement.

A dielectric plate 113 is horizontally arranged in the upper opening of a cylindrical processing vessel 111. A seal member 112 is disposed at the bonding portion between the processing vessel 111 and dielectric plate 113 so that the hermeticity in the processing vessel 111 is ensured. Vacuum exhausting exhaust ports 114 are formed in the bottom of the processing vessel 111. A gas supply nozzle 116 is formed in the side wall of the processing vessel 111. The processing vessel 111 accommodates a susceptor 122 on which a substrate 121 as an etching target is to be placed. An RF voltage is applied to the susceptor 122 from an RF power supply 126.

A radial antenna 130 is disposed on the dielectric plate 113 to supply a microwave MW into the processing vessel 111 as an RF electromagnetic field. The dielectric plate 113 and radial antenna 130 are covered by a seal material 117.

The radial antenna 130 is formed of two parallel conductive plates 131 and 132 which form a radial waveguide, and a ring member 133 which closes the edges of the conductive plates 131 and 132. The conductive plate 131 constituting the radiation surface of the microwave MW has a large number of slots 134. The radial antenna 130 is connected to a microwave generator 145 through a waveguide 141.

In the etching apparatus with this arrangement, the interior of the processing vessel 111 is set to a predetermined vacuum degree, and after that a gas mixture of, e.g., $CF_4$ and Ar, is supplied from the nozzle 116 under flow rate control. In this state, the microwave generator 145 supplies the microwave MW to the radial antenna 130 through the waveguide 141.

The microwave MW supplied to the radial antenna 130 is radiated from the large number of slots 134 formed in the conductive plate 131 while propagating in the radial waveguide. As the conductive plate 131 is a horizontally arranged flat plate, the microwave MW is radiated in the vertical direction. The microwave MW is transmitted through the dielectric plate 113 and introduced into the processing vessel 111.

The microwave MW introduced into the processing vessel 111 ionizes the gas in the processing vessel 111 to generate a plasma in a space S1 above the substrate 121 as the processing target. At this time, the microwave MW introduced into the processing vessel 111 is not entirely absorbed directly by plasma generation. That microwave MW which is not absorbed but is left repeats reflection in the processing vessel 111 to form a standing wave in a space S2 between the radial antenna 130 and plasma generating space S1. The microwave MW which forms the standing wave is also known to contribute to plasma generation.

The ions of the plasma generated in this manner are extracted by the negative potential of the susceptor 122 and utilized for the etching process.

With the conventional etching apparatus shown in FIG. 20, however, the plasma is not generated uniformly. The plasma generated in the processing vessel 111 with this etching apparatus was observed. Portions 151A and 151B where the plasma is generated at a high density were observed near the center of a plasma generating region 150, as shown in FIG. 5(a) to be mentioned later. Hence, conventionally, on the substrate 121 as the processing target, the etching process progressed faster at a region below a higher-density plasma. This problem of variations in process amount occurred not only in the etching apparatus shown in FIG. 20 but was common among the conventional plasma processing apparatuses.

The present invention has been made to solve the above problems, and has as its object to improve the distribution of the plasma generated by an RF electromagnetic field.

SUMMARY OF THE INVENTION

In order to achieve the above object, a plasma processing apparatus according to the present invention is characterized in that at least one of a first conductive plate constituting the radiation surface of a slot antenna and a second conductive plate opposed to the first conductive plate inclines relative to a first dielectric member opposed to the radiation surface of the slot antenna. As the slot antenna, a radial antenna, a cavity antenna, or the like can be used.

The operation of the plasma processing apparatus will be described. When the first conductive plate of the slot antenna inclines with respect to the first dielectric member, the electromagnetic field from the slot antenna enters in a direction inclining with respect to the direction of normal to the first dielectric member. In a processing vessel, a plasma plane opposing the first dielectric member forms a shape conforming to the first dielectric member. Hence, the electromagnetic field entering a plasma in the processing vessel directly from the slot antenna through the first dielectric member enters in a direction inclining with respect to the direction of normal to the plasma plane.

A change in electric field of the electromagnetic field since the boundary between the plasma and the first dielectric member and a point where the plasma density reaches a cutoff density will be briefly described. The strength of a component in a direction parallel to the plasma plane maintains a substantially constant value, while the strength of a component in the direction of normal to the plasma plane increases monotonously. Therefore, when the electromagnetic field enters in a direction inclining with respect to the direction of normal to the plasma plane, the strength of the electric field as the synthesis of the two components can be increased more when compared to a case wherein the electromagnetic field enters in the direction of normal to the plasma plane. As a result, the plasma generating efficiency of the electric field of the electromagnetic field entering directly from the slot antenna can be improved.

Contribution of the electric field of the electromagnetic field entering directly from the slot antenna into the processing vessel to plasma generation increases, so that contribution of the electric field of a standing wave formed in the processing vessel to plasma generation decreases relatively. Since the former can be controlled more easily than the latter, the plasma distribution can be improved over the conventional one.

Similarly, when the first conductive plate inclines with respect to the first dielectric member, the space between the first conductive plate and the plasma plane deforms. Accordingly, the standing wave mode changes, so the plasma generation distribution changes.

When one of the first and second conductive plates that form the slot antenna inclines with respect to the other one, the space in the antenna has a distribution. Therefore, when the distribution of the characteristic impedance of the antenna is adjusted and the distribution of the radiation amount of the antenna is adjusted, the plasma generation distribution is adjusted.

In the plasma processing apparatus of the present invention described above, the first and second conductive plates of the slot antenna, and the first dielectric member have a common central axis, and may have stereoscopic shapes each symmetrical with respect to this central axis. In other words, the sectional shapes obtained by cutting each stereoscopic shape at any plane including the central axis may be symmetrical with respect to the central axis.

At least one of the first and second conductive plates and first dielectric member may have an upward convex shape or downward convex shape, so that the first and second conductive plates of the slot antenna incline with respect to the first dielectric member.

A gap between the first and second conductive plates may be set to 5 mm or more and less than $\lambda g/2$ where $\lambda g$ ($\lambda g > 10$ mm) is the wavelength of an electromagnetic field between the first and second conductive plates. When the gap is 5 mm or more, electric discharge between the conductive plates can be prevented. When the gap is set to less than $\lambda g/2$, formation of a standing wave between the conductive plates can be prevented.

In the plasma processing apparatus of the present invention described above, the first dielectric member may have a flat plate-like shape or a dome-like shape.

The first dielectric member may be constituted by a bell jar which isolates at least part of an inner surface of the processing vessel from a susceptor arranged in the processing vessel. Then, contamination occurring when the generated plasma comes into contact with the inner surface of the processing vessel to sputter it can be suppressed.

The plasma processing apparatus may further comprise a second dielectric member arranged on a side different from the susceptor with respect to the first dielectric member and serving to form a sealed space together with the first dielectric member, and supply means for supplying a fluid in the sealed space so as to adjust a temperature of the first dielectric member. The second dielectric member may be arranged between the first dielectric member and the slot antenna, or midway along the feeder of the slot antenna.

BRIEF DESCRIPTION OF THE DRAWINGS

FIG. 3 is an enlarged sectional view of the radial antenna;

FIG. 4 includes views for explaining apparatuses each used for photographing a plasma;

DETAILED DESCRIPTION OF THE EMBODIMENTS

The embodiments of the present invention will be described in detail with reference to the accompanying drawings.

First Embodiment

Figure 1:
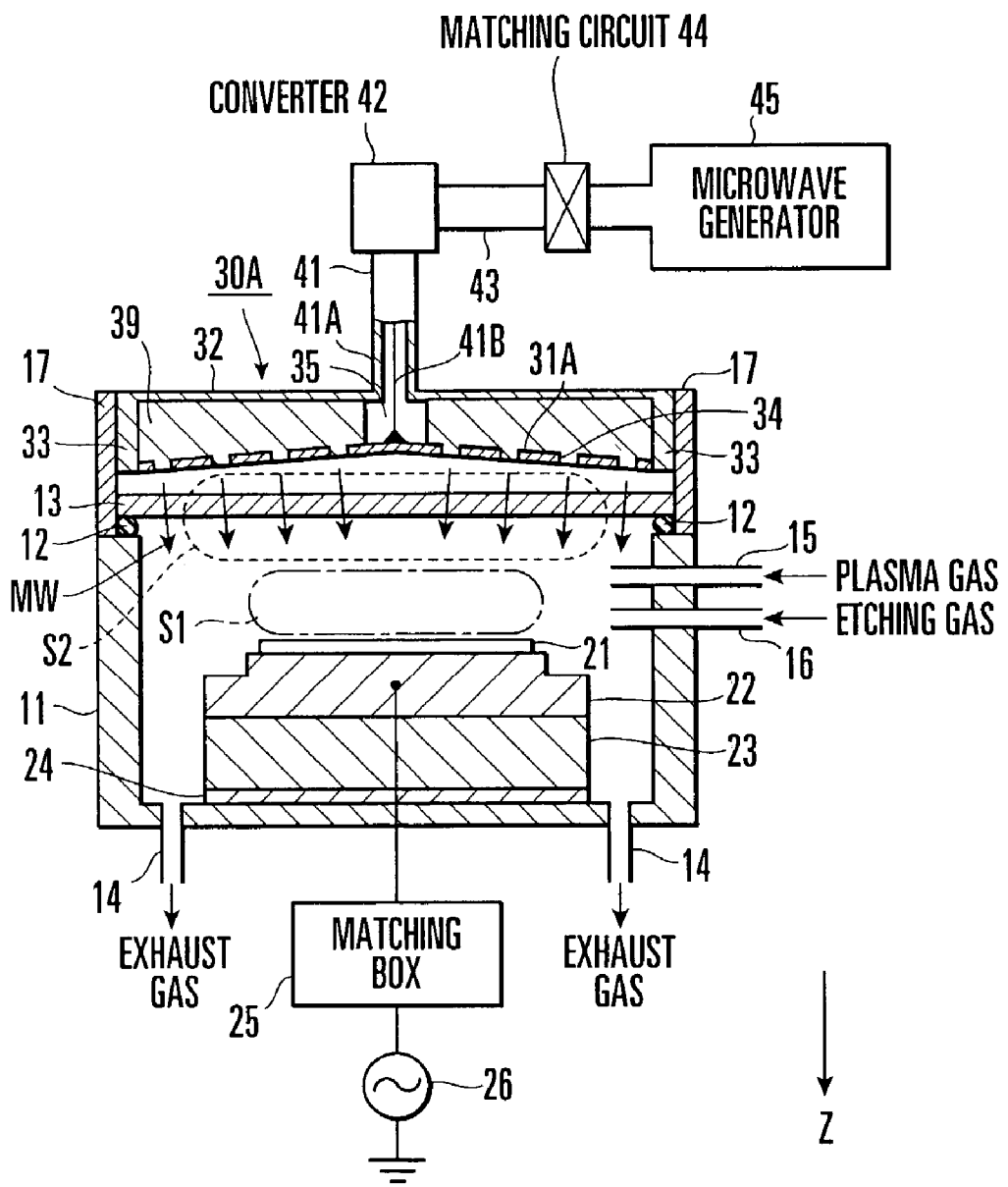
FIG. 1 is a view showing the arrangement of an etching apparatus according to the first embodiment of the present invention.

An embodiment in which the present invention is applied to an etching apparatus will be described. FIG. 1 is a view showing the arrangement of an etching apparatus according to the first embodiment of the present invention. FIG. 1 shows the sectional structure of part of the arrangement. For the sake of descriptive convenience, the vertical direction is defined as the Z-axis direction.

The etching apparatus shown in FIG. 1 has a cylindrical processing vessel 11 with an upper opening. The processing vessel 11 is made of a conductor such as aluminum. A flat plate-like dielectric plate (first dielectric member) 13 is horizontally arranged in the upper opening of the processing vessel 11. A quartz glass or a ceramic material (e.g., $Al_2O_3$ or AlN) with a thickness of about 20 mm to 30 mm is used to form the dielectric plate 13. A seal member 12 such as an O-ring is disposed at the bonding portion between the processing vessel 11 and dielectric plate 13. This assures the hermeticity in the processing vessel 11.

Exhaust ports 14 communicating with a vacuum pump (not shown) are formed in the bottom of the processing vessel 11, so that the interior of the processing vessel 11 can be evacuated to a predetermined vacuum degree.

A plasma gas supply nozzle 15 for introducing a plasma gas such as Ar into the processing vessel 11, and a process gas supply nozzle 16 for introducing an etching gas such as $CF_4$ into the processing vessel 11 are formed in the upper and lower portions, respectively, of the side wall of the processing vessel 11. The nozzles 15 and 16 are formed of quartz pipes or the like.

The processing vessel 11 accommodates a susceptor 22 for placing an etching target substrate (target object) 21 on its upper surface. The susceptor 22 is fixed on a support table 23 which is fixed to the bottom of the processing vessel 11 through an insulating plate 24. The susceptor 22 is connected to a bias RF power supply 26 through a matching box 25. The RF power supply 26 generates a high frequency of, e.g., 2 MHz to 13.56 MHz.

A radial antenna 30A is disposed on the dielectric plate 13 with its radiation surface (conductive plate 31 to be described later) facing down. The radial antenna 30A supplies a microwave MW into the processing vessel 11 as an RF electromagnetic field. The dielectric plate 13 is opposed to the radiation surface of the radial antenna 30A, and covers the radiation surface entirely. Hence, the radial antenna 30A is protected from a plasma generated in the processing vessel 11. The circumferential surfaces of the dielectric plate 13 and radial antenna 30A are covered by a shield material 17.

The radial antenna 30A is formed of a first conductive plate 31A constituting the radiation surface, a second conductive plate 32 arranged above the conductive plate 31A to oppose it, and a ring member 33 for closing the edges of the conductive plates 31A and 32. The conductive plates 31A and 32, and the ring member 33 are made of a conductor such as copper or aluminum.

A microwave inlet port 35 is formed at the center of the conductive plate 32 constituting the antenna upper surface. A large number of slots 34 are formed as radiating elements in the conductive plate 31A constituting the antenna lower surface. The two conductive plates 31A and 32 form a radial waveguide which guides the microwave MW.

The conductive plates 31A and 32 of the radial antenna 30A, and the dielectric plate 13 have a common central axis in the Z-axis direction, and have stereoscopic shapes which are symmetrical with respect to the central axis. In other words, a sectional shape obtained by cutting each stereoscopic shape at any plane including the central axis is symmetrical with respect to the central axis.

Figures 2A, 2B:
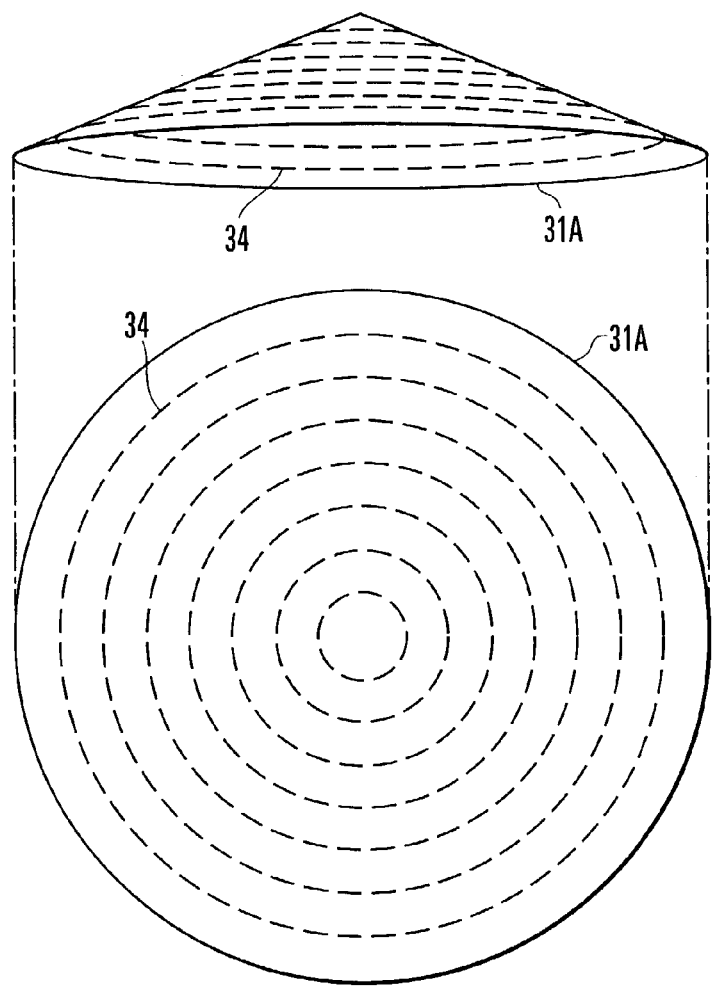
FIG. 2 includes views showing the arrangement of a first conductor constituting the lower surface of a radial antenna.

FIG. 2 includes views showing the arrangement of the conductive plate 31A constituting the lower surface of the radial antenna 30A, in which FIG. 2(a) is a perspective view, and FIG. 2(b) is a plan view.

As shown in FIG. 1, the conductive plate 32 constituting the antenna upper surface is a flat plate. In contrast to this, as shown in FIG. 2(a), the conductive plate 31A constituting the lower surface has an upward convex circular conical surface. Accordingly, the circular conical surface of the conductive plate 31A inclines with respect to the flat plate-like dielectric plate 13. This is the characteristic feature of the etching apparatus shown in FIG. 1.

The conductive plate 31A has a large number of concentric slots 34 extending in the circumferential direction, as shown in FIG. 2(b). Each slot 34 is formed along the direction of normal to that portion of the conductive plate 31A where it is formed. The length of each slit 34 and the pitch among the slots 34 which are adjacent in the radial direction are set on the basis of a wavelength (wavelength which is shortened by a delay member 39 (to be described later)) $\lambda g$ of the microwave MW in the radial waveguide. To realize a so-called leak antenna, the pitch is set to about $\lambda g/20$ to $\lambda g/30$.

FIG. 3 is an enlarged sectional view of the radial antenna 30A, and shows a support mechanism for the conductive plate 31A.

As shown in FIG. 3, the center of the conductive plate 32 is thick, and has three rectangular or circular through holes 61. The three through holes 61 are formed equiangularly on one circumference having the center of the conductive plate 32 as its center. Studs 62 with a sufficient length are inserted in the through holes 61. The conductive plate 31A is fixed to the lower surfaces of the studs 62 by fastening screws 63. The studs 62 fixed to the conductive plate 31A by fastening are fixed to the conductive plate 32 with nuts 64. The inclination of the conductive plate 31A can be set to a desired angle by adjusting the fixing positions of the nuts 64. As the studs 62 and screws 63, those made of a dielectric such as a ceramic material can be used.

Alternatively, the studs 62 may not be fixed to the conductive plate 32 with the nuts 64, but the angle of inclination of the conductive plate 31A may be changed through remote control of vertically moving the studs 62 by utilizing a driving unit such as a motor.

Referring back to the description of FIG. 1, in the radial antenna 30A, the gap between the two conductive plates 31A and 32 is set to 5 mm or more and less than $\lambda g/2$ where $\lambda g/2$ >10 mm. For example, when a microwave MW of 2.45 GHz is to be used, the gap between the conductive plates 31A and 32 is less than 6 cm. In this case, the gap at the vertex of the conductive plate 31A is set to 5 mm or more, and the gap at the circumference of the conductive plate 31A is set to less than 6 cm. When the gap is set to 5 mm or more, electric discharge between the conductive plates 31A and 32 can be prevented. When the gap is set to less than $\lambda g/2$, formation of a standing wave between the conductive plates 31A and 32 can be prevented.

The radial waveguide formed of the conductive plates 31A and 32 accommodates the delay member 39 made of a dielectric material, e.g., a ceramic material, with a relative dielectric constant larger than 1. The delay member 39 has a function of shortening the wavelength of the microwave MW by decreasing the propagation speed of the microwave MW it acts on. The delay member 39 can improve the radiation efficiency of the microwave MW of the radial antenna 30A.

A coaxial cable 41 is connected to the center of the radial antenna 30A. An outer conductor 41A of the coaxial cable 41 is connected to the periphery of the microwave inlet port 35 of the conductive plate 32. The distal end of a central conductor 41B of the coaxial cable 41 forms a circular cone, and the bottom of the circular cone is connected to the vertex of the conductive plate 31A.

The coaxial cable 41 connected to the radial antenna 30A in this manner is connected to a microwave generator 45 through a rectangular coaxial converter 42 and rectangular waveguide 43. The microwave generator 45 generates the microwave MW of, e.g., 2.45 GHz. The frequency of the microwave MW suffices if it falls within the range of 1 GHz to 19 GHz. A matching circuit 44 for matching the impedance is connected midway along the rectangular waveguide 43, so that the power use efficiency can be improved.

The operation of the etching apparatus shown in FIG. 1 will be described.

The substrate 21 is placed on the upper surface of the susceptor 22, and the interior of the processing vessel 11 is set to a vacuum degree of, e.g., about 0.01 Pa to 10 Pa. While maintaining this vacuum degree, Ar is supplied as the plasma gas from the plasma gas supply nozzle 15, and an etching gas such as $CF_4$ is supplied from the process gas supply nozzle 16 under flow rate control.

With the plasma gas and etching gas being supplied into the processing vessel 11, the microwave MW from the microwave generator 45 is supplied to the radial antenna 30A through the rectangular waveguide 43, rectangular coaxial converter 42, and coaxial cable 41.

The microwave MW supplied to the radial antenna 30A propagates radially from the center toward the periphery of the radial waveguide formed of the conductive plates 31A and 32, and leaks little by little from the large number of slots 34 formed with a fine pitch.

The microwave MW leaking from the radial antenna 30A is transmitted through the dielectric plate 13 and is introduced into the processing vessel 11. The electric field of the microwave MW ionizes Ar, thus generating a plasma in a space S1 above the substrate 11 as the processing target.

In this etching apparatus, the susceptor 22 is biased with a negative potential, so that ions are extracted from the generated plasma to etch the substrate 21.

The effect of the etching apparatus shown in FIG. 1 will be described through comparison with the conventional etching apparatus shown in FIG. 20. The plasma generated by each of the etching apparatuses shown in FIGS. 1 and 20 was photographed so as to examine its distribution. FIG. 4 includes views of apparatuses used for this photographing, in which FIG. 4(a) is a sectional view showing the size of the radial antenna 130 of the etching apparatus shown in FIG. 20, FIG. 4(b) is a sectional view showing the size of the radial antenna 30A of the etching apparatus shown in FIG. 1, and FIG. 4(c) shows the arrangement of a CCD camera.

In plasma photographing, a CCD camera 29 was arranged at the center of the susceptor 22 or 122 where the substrate 21 or 121 is not placed, and the plasma generating space S1 was photographed. Regarding the conventional etching apparatus, the radial antenna 130 with the size as shown in FIG. 4(a) was used. More specifically, the diameter and thickness of the conductive plate 131 were set to 480 mm and 0.8 mm, respectively, and the height of the ring member 133 was set to 15 mm. Regarding the etching apparatus shown in FIG. 1, the radial antenna 30A with the size as shown in FIG. 4(b) was used. More specifically, the diameter and thickness of the conductive plate 31A and the height of the ring member 33 were set to be equal to those of the radial antenna 130, while the height at the center (height of the circular conical surface) of the conductive plate 31A with reference to its circumference was set to 5 mm.

Figures 5A, 5B:
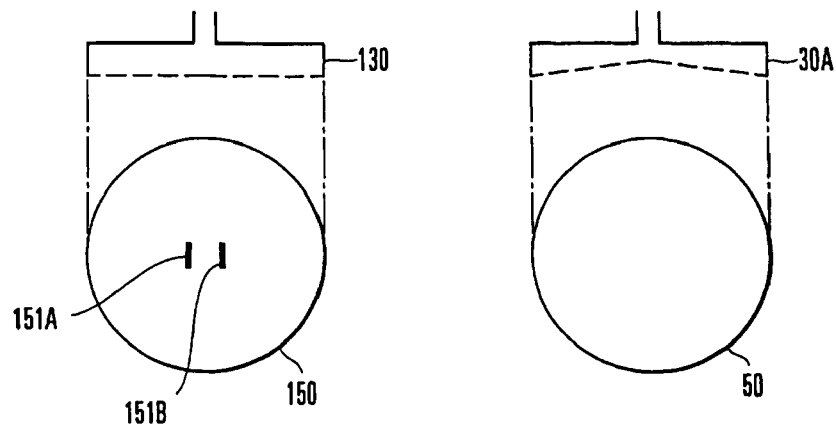
FIG. 5 includes schematic views of images each obtained when the plasma is photographed.
Figure 20:
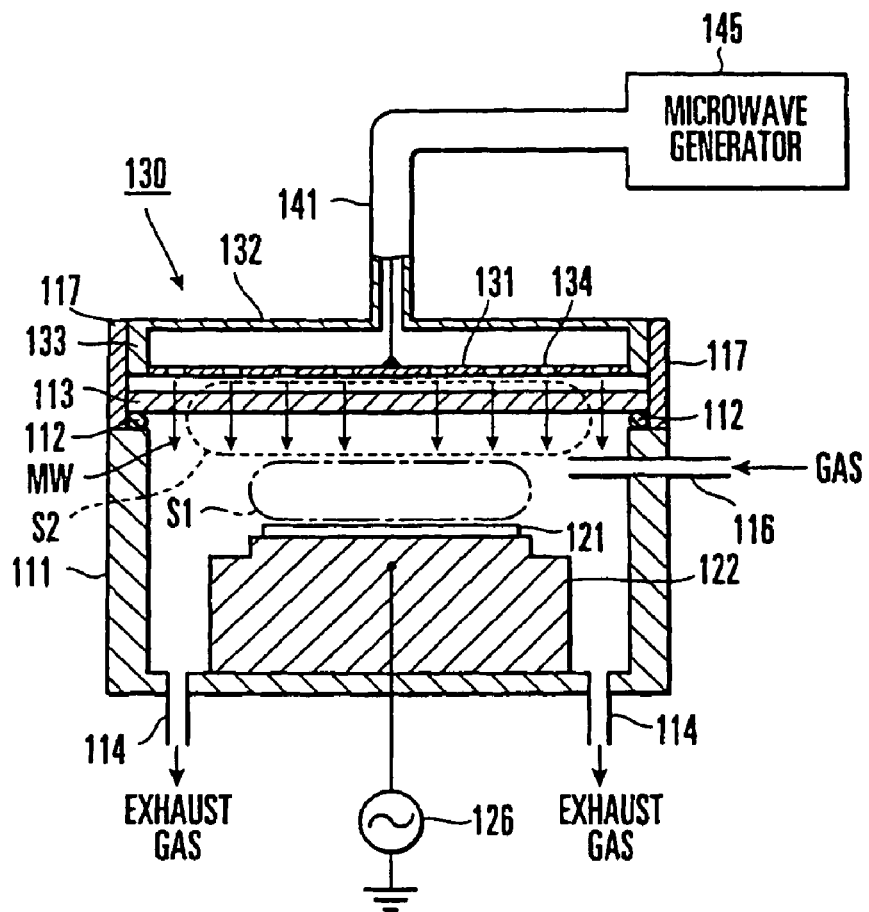
FIG. 20 is a view showing the arrangement of an etching apparatus which uses a conventional microwave plasma processing apparatus.

FIG. 5 includes schematic views of images obtained when the plasmas were photographed under these conditions, in which FIG. 5(a) shows an image obtained with the etching apparatus shown in FIG. 20, and FIG. 5(b) shows an image obtained with the etching apparatus shown in FIG. 1. As shown in FIG. 5(a), with the conventional etching apparatus using the radial antenna 130 with the radial waveguide formed of parallel plates, the portions 151A and 151B where the plasma was generated at a high density were observed near the center of the plasma generating region 150. In contrast to this, with the etching apparatus shown in FIG. 1 using the radial antenna 30A with the circular conical conductive plate 31A serving as the radiation surface, as shown in FIG. 5(b), no portion 151A or 151B where a plasma was generated at a high density was observed in a plasma generating region 50, and a uniformly distributed plasma was observed.

In this manner, with the etching apparatus shown in FIG. 1, a plasma which is distributed uniformly can be obtained when compared to the conventional etching apparatus. Thus, an effect of suppressing variations in etching the substrate 21 can be obtained.

The reason the distribution of the plasma is improved by using the radial antenna 30A with the structure as shown in FIG. 1 will be studied.

Part of the microwave MW introduced from the radial antenna 30A into the processing vessel 11 is not absorbed by plasma generation, but forms a standing wave in a space S2 between the radial antenna 30A and plasma generating space S1, and the electric field of the standing wave contributes to plasma generation. This is the same as in the conventional etching apparatus. Therefore, in the etching apparatus shown in FIG. 1 as well, both the electric field of the microwave MW which has entered the plasma from the radial antenna 30A directly and the electric field of the standing wave formed in the processing vessel 11 contribute to plasma generation.

The reason the distribution of the plasma is improved in the etching apparatus shown in FIG. 1 can be described from the following three viewpoints of (1) improvement in plasma generating efficiency of the electric field of the microwave MW which has entered directly, (2) adjustment of the distribution in the space in the radial antenna 30A, and (3) change in shape of the standing wave forming space S2.

Figure 6A:
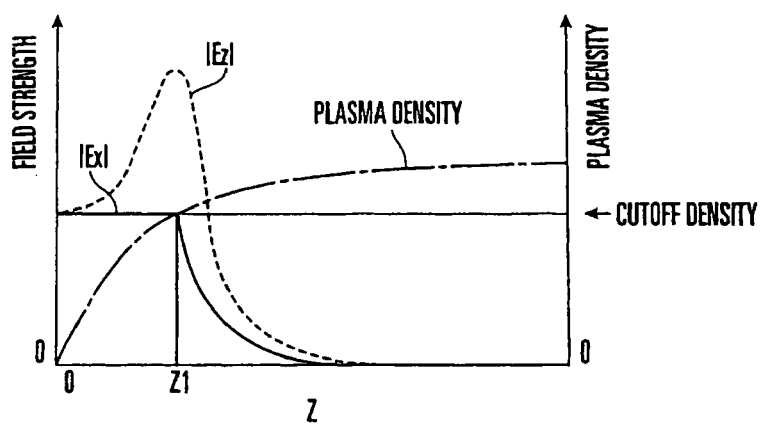
FIG. 6 includes conceptual graphs showing a change in density of a plasma having a plasma plane perpendicular to a Z-axis direction and a change in field strength of a microwave that has entered this plasma.

(1) Improvement in Plasma Generating Efficiency of Electric Field of Microwave MW Which has Entered Plasma Directly from Radial Antenna 30A:

FIG. 6 includes conceptual graphs showing a change in density of a plasma having a plasma plane perpendicular to the Z-axis direction (vertical direction in FIG. 1) and a change in field strength of a microwave that has entered this plasma. Referring to FIG. 6(a), the axis of abscissa represents the distance in the Z-axis direction from the boundary plane between the plasma and the dielectric plate 13, and the axes of ordinate represent the plasma density and the field strength. When an X-axis is formed perpendicularly to the Z-axis, the solid line indicates the strength of an X-axis direction component (that is, a component in a direction parallel to the plasma plane) Ex of an electric field E of the microwave MW, the broken line indicates the strength of a Z-axis direction component (that is, a component in the direction of normal to the plasma plane) Ez of the electric field E of the microwave MW, and an alternate long and short dashed line indicates the plasma density.

The density of the plasma with the plasma plane perpendicular to the Z-axis increases as the distance from the boundary plane between the plasma and the dielectric plate 13 increases in the Z-axis direction, as indicated by the alternate long and short dashed line in FIG. 6(a). The density where the dielectric constant of the plasma is zero with respect to a certain frequency is called the cutoff density at this frequency.

Figure 6B:
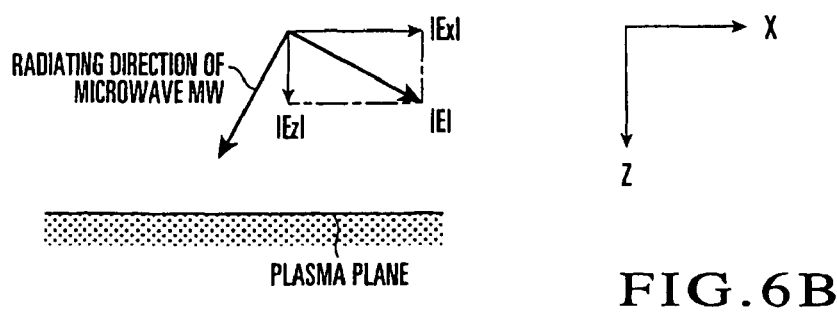

Assume that the microwave MW enters this plasma in a direction inclining with respect to the Z-axis as shown in FIG. 6(b). As indicated by the solid line in FIG. 6(a), the strength of the X-axis direction component Ex of the electric field maintains a substantially constant value until a point Z1 where the plasma density reaches the cutoff density, but decreases exponentially when the plasma density exceeds this point Z1. In contrast to this, as indicated by the broken line in FIG. 6(a), the strength of the Z-direction component Ez of the electric field increases immediately after the microwave enters the plasma, reaches the maximum at the point Z1, and then decreases. This principle is described in "R. B. White, F. F. Chen, Amplification and Absorption of Electromagnetic Waves in Overdense Plasmas, Plasma Physics, vol. 16, pp. 565-587".

When the microwave MW enters in a direction inclining with respect to the Z-axis direction (that is, in the direction of normal to the plasma plane), the electric field forms the Z-direction component Ez. Hence, the field strength as the synthesis of the two components Ex and Ez can be increased when compared to a case wherein the microwave MW enters in the Z-axis direction.

In the etching apparatus shown in FIG. 1, the conductive plate 31A constituting the radiation surface of the radial antenna 30A has an upward convex circular conical surface, as described above. In other words, the conductive plate 31A inclines with respect to the horizontal plane. The microwave MW leaking from the slots 34 formed in the conductive plate 31A is radiated in a direction inclining with respect to the vertical direction (Z-axis direction), and enters the horizontally arranged dielectric plate 13 with a predetermined angle with respect to the direction of normal (Z-axis direction) to it. The plasma generating space S1 in the processing vessel 11 is limited by the dielectric plate 13. Thus, the plasma plane opposing the dielectric plate 13 extends along the dielectric plate 13 to form a horizontal surface. Therefore, the microwave MW leaking from the conductive plate 31A enters the plasma in a direction inclining with respect to the direction of normal (Z-axis direction) to the plasma plane opposing the dielectric plate 13.

Hence, according to the principle described above, when the radial antenna 30A is used, an electric field larger than the conventional one can be formed in the plasma generating space S1. Thus, the plasma generating efficiency by the electric field of the microwave MW that has entered directly from the radial antenna 30A can be increased. As a result, contribution of the electric field of the microwave MW, that has entered directly from the radial antenna 30A, to plasma generation increases, and contribution of the electric field of the standing wave formed in the space S2 in the processing vessel 11 to plasma generation decreases relatively.

Plasma generation by the electric field of the microwave MW that has entered the plasma directly from the radial antenna 30A can be controlled comparatively easily. For example, plasma generation can be controlled by adjusting the arrangement of the slots 34 of the radial antenna 30A. In contrast to this, plasma generation by the electric field of the standing wave is difficult to control. In the etching apparatus shown in FIG. 1, as described above, plasma generation by the electric field of the microwave MW that has entered directly can set dominant over plasma generation by the electric field of the standing wave, and accordingly plasma generation can be controlled to form a desired plasma distribution. This may be the reason a uniform plasma distribution as shown in FIG. 5(b) can be obtained.

Figure 7:
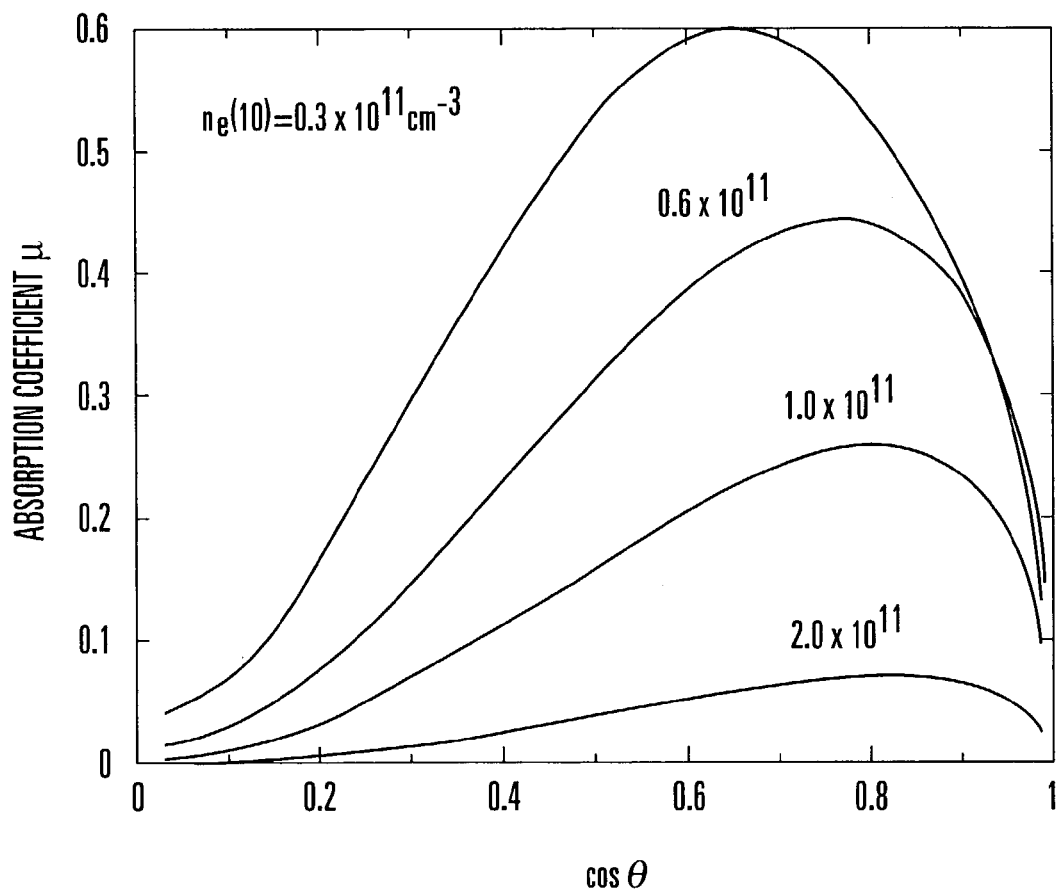
FIG. 7 is a graph showing the angle dependency of the absorption coefficient of the microwave.

FIG. 7 is a graph showing the angle dependency of the absorption coefficient of the microwave MW. The axis of abscissa represents the cosine of a radiation angle θ of the microwave MW with respect to the radiation surface, and the axis of ordinate represents an absorption coefficient η. FIG. 7 shows that the absorption coefficient becomes the maximum when the radiation angle is almost 30° to 50°, although it may depend on an electron density $n_e$ of the plasma. When the microwave MW is radiated at this angle θ, plasma generation by the electric field of the microwave MW that has entered directly from the radial antenna 30A becomes dominant, so that the plasma distribution can be controlled accurately.

(2) Adjustment of Distribution in Space in Radial Antenna 30A:

The distribution in the space in the radial antenna 30A (that is, the gap between the two conductive plates 31A and 32 shown in FIG. 4(b)) is related to the distribution of the characteristic impedance of the radial antenna 30A. The distribution of the characteristic impedance is related to the distribution of the leakage amount of the microwave MW from the radial antenna 30A. More specifically, at the center of the radial antenna 30A (near the vertex of the circular conical surface) where the gap between the conductive plates 31A and 32 is small, the characteristic impedance is small, and accordingly the leakage amount is large. At the periphery of the radial antenna 30A where the gap between the conductive plates 31A and 32 is large, the characteristic impedance is large, and accordingly the leakage amount is small. In this manner, since the internal space of the radial antenna 30A has a distribution, the distribution of the leakage amount of the microwave MW may be adjusted, so that the distribution of plasma generation may be adjusted.

(3) Change in Shape of Standing Wave Forming Space S2:

As the conductive plate 31A constituting the radiation surface has a circular conical surface, the standing wave forming space S2 deforms. This changes the standing wave mode, so that the distribution of plasma generation may be changed.

Modifications of the radial antenna 30A shown in FIG. 1 will be described.

Figure 8:
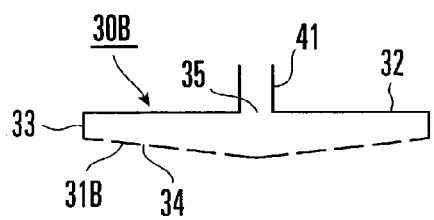
FIG. 8 is a view schematically showing the sectional shape of the radial antenna according to the first modification.

FIG. 8 is a view schematically showing the sectional shape of a radial antenna according to the first modification. As in a radial antenna 30B shown in FIG. 8, a conductive plate 31B having a downward convex circular conical surface may be used as the first conductive plate constituting the radiation surface.

Figure 9A:
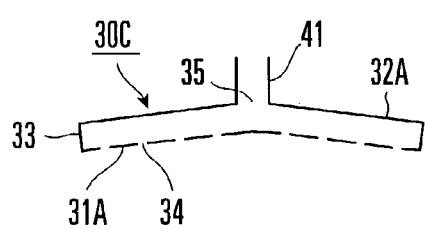
FIG. 9 includes views each schematically showing the sectional shape of the radial antenna according to the second modification.
Figure 9B:
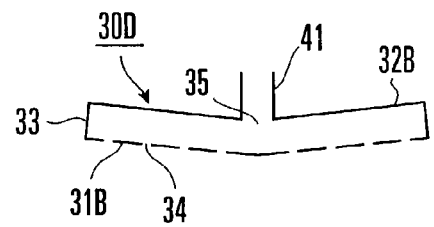

FIG. 9 includes views each schematically showing the sectional shape of a radial antenna according to the second modification. A radial antenna 30C shown in FIG. 9(a) is formed by arranging parallel to each other first and second conductive plates 31A and 32A forming upward convex circular conical surfaces. A radial antenna 30D shown in FIG. 9(b) is formed by arranging parallel to each other first and second conductive plates 31B and 32B forming downward convex circular conical surfaces. In the radial antennas 30C and 30D, the distribution of plasma generation in the processing vessel 11 cannot be adjusted by adjusting the impedance distribution of the internal space. However, the plasma generating efficiency by the electric field of the microwave MW that has entered directly from the radial antenna 30C or 30D to the plasma can be improved, and the electric field of the standing wave can be weakened by deformation of the standing wave forming space S2. Therefore, a plasma distribution better than a conventional one can be obtained.

Figure 10A:
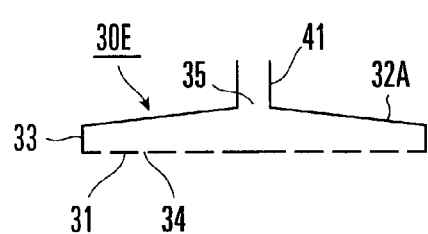
FIG. 10 includes views each schematically showing the sectional shape of the radial antenna according to the third modification.
Figure 10B:
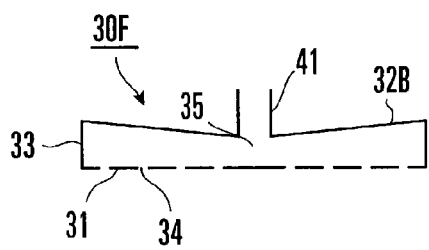

FIG. 10 includes views each schematically showing the sectional shape of a radial antenna according to the third modification. A radial antenna 30E shown in FIG. 10(a) uses a flat plate-like conductive plate 31 as the first conductive plate constituting the radiation surface, and a conductive plate 32A forming an upward convex circular conical surface as the second conductive plate. A radial antenna 30F shown in FIG. 10(b) uses a flat plate-like conductive plate 31 as the first conductive plate similarly, and a conductive plate 32B forming a downward convex circular conical surface as the second conductive plate. In the radial antennas 30E and 30F, the distribution of plasma generation in the processing vessel 11 can be adjusted by adjusting the impedance distribution of the internal space. Therefore, a plasma distribution better than the conventional one can be obtained.

Each of the radial antennas 30A to 30F exemplified above uses a conductive plate forming an upward or downward convex circular conical surface as the first or second conductive plate. Alternatively, the first or second conductive plate may form another convex shape such as a curved surface.

The radial antenna need not be of a leak type but can be of a so-called radiation type. To realize a radiation type antenna, the pitch among the slots 34 which are adjacent in the radial direction may be set to be almost equal to the wavelength λg of the microwave MW in the radial waveguide.

Second Embodiment

Figure 11:
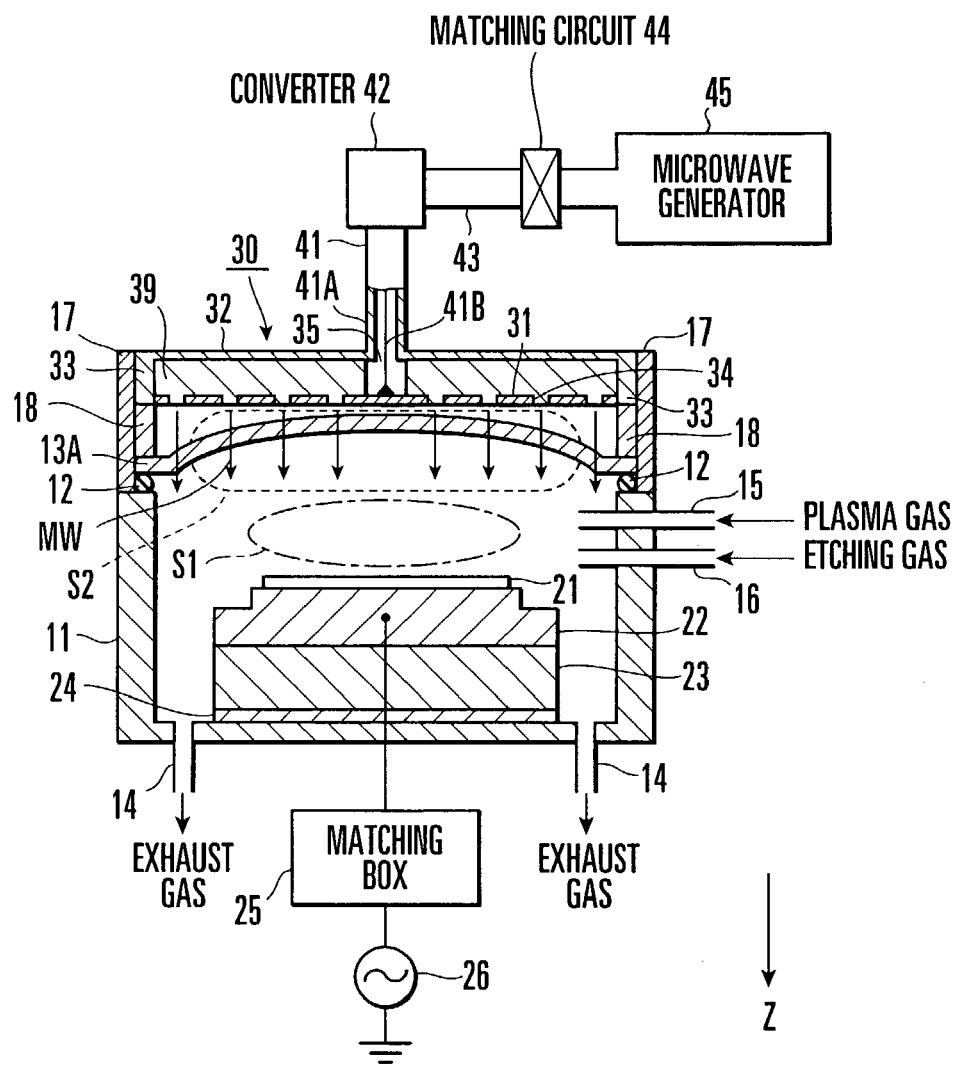
FIG. 11 is a view showing the arrangement of an etching apparatus according to the second embodiment of the present invention.

FIG. 11 shows the arrangement of an etching apparatus according to the second embodiment of the present invention. In FIG. 11, the same portions as in FIG. 1 are denoted by the same reference numerals, and a description thereof will be omitted when necessary.

In a radial antenna 30 used in this etching apparatus, a first conductive plate 31 constituting the radiation surface and a second waveguide 32 which forms a radial waveguide together with the conductive plate 31 are formed of parallel plates. The conductive plates 31 and 32 are arranged horizontally. A dielectric plate (first dielectric member) 13A opposed to the radiation surface of the radial antenna 30 forms a dome. Hence, the dielectric plate 13A has a surface inclining with respect to the radiation surface of the radial antenna 30. The dielectric plate 13A has a shape which is symmetrical with respect to the central axis. A cylindrical spacer 18 is interposed between the dielectric plate 13A and radial antenna 30. The dielectric plate 13, radial antenna 30A, and spacer 18 are covered by a shield material 17.

As described above, the conductive plate 31 constituting the radiation surface of the radial antenna 30 is a horizontally arranged flat plate. Hence, a microwave MW leaking from slots 34 formed in the conductive plate 31 is radiated in the vertical direction (Z-axis direction).

As a plasma generating space S1 in a processing vessel 11 is limited by the dielectric plate 13A, the plasma plane opposing the dielectric plate 13A forms a curved surface extending along the dielectric plate 13A. The direction of normal to the plasma plane inclines with respect to the vertical direction (Z-axis direction) except for its center. Hence, the microwave MW radiated from the conductive plate 31A in the vertical direction (Z-axis direction) enters the plasma in a direction inclining with respect to the direction of normal to the plasma plane opposing the dielectric plate 13A. This state is identical with the case which uses the radial antenna 30A shown in FIG. 1.

Therefore, due to the same principle as that described above, plasma generation by the electric field of the microwave MW that has entered the plasma directly from the radial antenna 30 can be set dominant over plasma generation by the electric field of the standing wave. As a result, a plasma distribution better than the conventional one can be obtained.

The dielectric plate 13A may have another convex shape such as an upward or downward convex circular conical surface.

Third Embodiment

Figure 12:
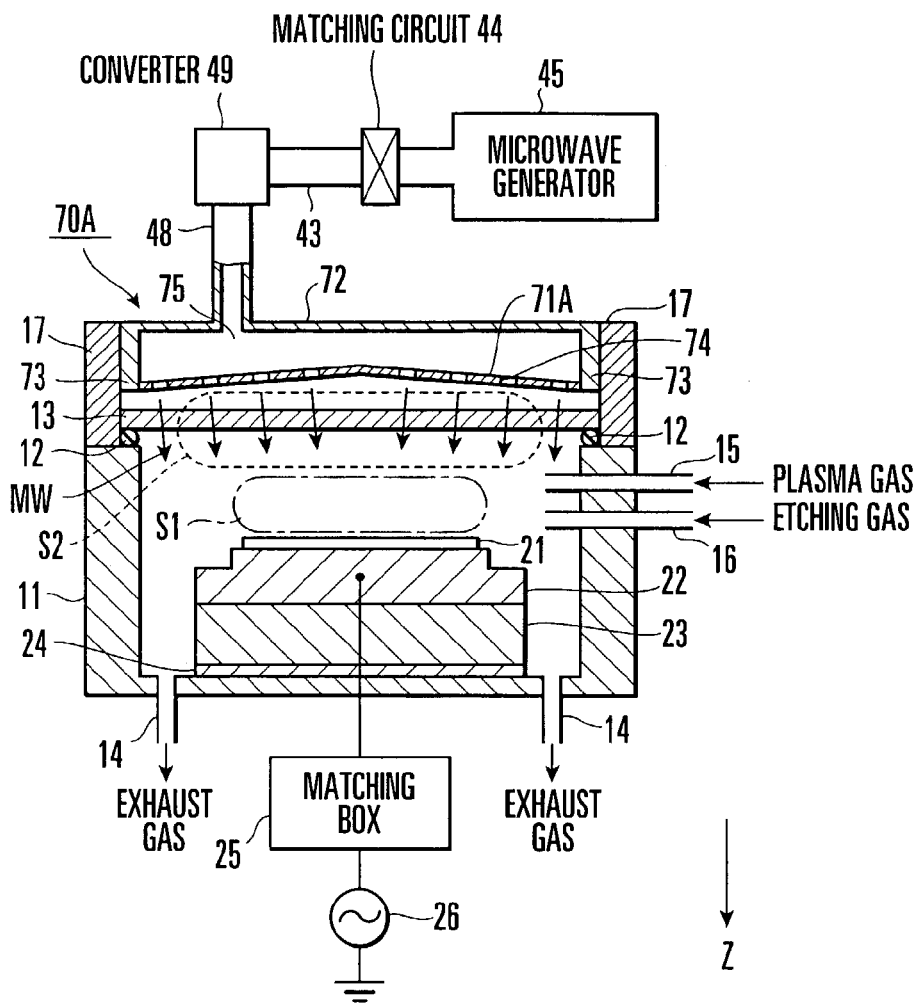
FIG. 12 is a view showing the arrangement of an etching apparatus according to the third embodiment of the present invention.
Figure 13:
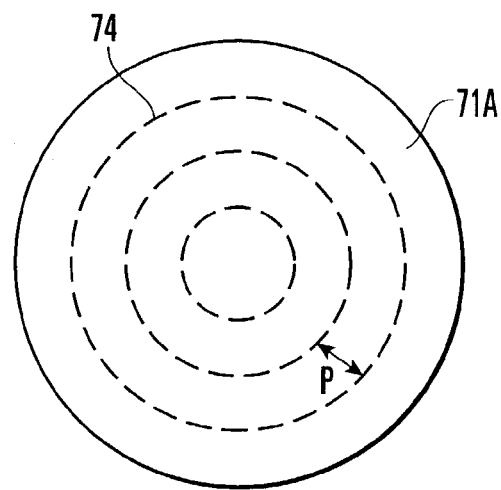
FIG. 13 is a plan view of a first conductive plate constituting the lower surface of a cavity antenna.

So far cases using radial antennas have been described. The present invention is not limited to them, and the same effect can be obtained by using another slot antenna, e.g., a cavity antenna with slots formed in the antenna lower surface. FIG. 12 shows the arrangement of an etching apparatus according to the third embodiment of the present invention to which a cavity antenna is applied. In FIG. 12, the same portions as in FIG. 1 are denoted by the same reference numerals, and a description thereof will be omitted when necessary. FIG. 13 is a plan view of the radiation surface of the cavity antenna.

A cavity antenna 70A is formed of a first conductive plate 71A constituting the radiation surface, a second conductive plate 72 arranged above the conductive plate 71A to oppose it, and a ring member 73 for closing the edges of the conductive plates 71A and 72. The conductive plates 71A and 72, and the ring member 73 are made of a conductor such as copper or aluminum.

The conductive plate 72 which forms the antenna upper surface has a microwave inlet port 75 for introducing a microwave MW from a microwave generator 45 into the antenna. The microwave inlet port 75 need not be formed at the center of the conductive plate 72.

The conductive plate 71A which forms the antenna lower surface has a plurality of concentric slots 74 extending in the circumferential direction, as shown in FIG. 13. The conductive plate 71A forms an upward convex circular conical surface in the same manner as the conductive plate 31A of the radial antenna 30A shown in FIG. 2. Accordingly, the circular conical surface of the conductive plate 71A inclines with respect to a flat plate-like dielectric plate 13.

The conductive plates 71A and 72, and the ring member 73 form a cavity resonator which causes the microwave MW to resonate with a predetermined mode. A delay member may be arranged in the cavity resonator.

The length of each slot 74 formed in the conductive plate 71A, and a pitch P among the slots 74 which are adjacent in the radial direction are set on the basis of a wavelength λg of the microwave MW in the cavity resonator. Of the length and the pitch P, the pitch P is desirably λg, but can be less than λg.

In FIG. 12, reference numeral 48 denotes a cylindrical waveguide; and 49, a rectangular cylindrical converter.

The cavity antenna used in the present invention suffices if at least one of the two conductive plates that form the upper and lower surfaces of the antenna inclines with respect to the dielectric plate 13, in the same manner as in the radial antennas 30A to 30F described above. FIG. 14 includes views each schematically showing the sectional shape of a modification of such a cavity antenna.

Figure 14A:
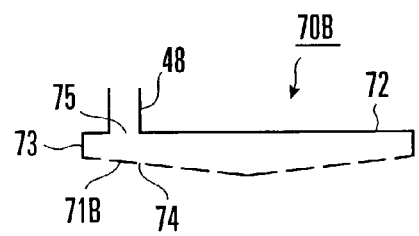
FIG. 14 includes views each schematically showing the sectional shape of a modification of a cavity antenna.

A cavity antenna 70B shown in FIG. 14(a) uses a conductive plate 71B forming a downward convex circular conical surface as the first conductive plate constituting the radiation surface, and corresponds to the radial antenna 30B shown in FIG. 8.

Figure 14B:
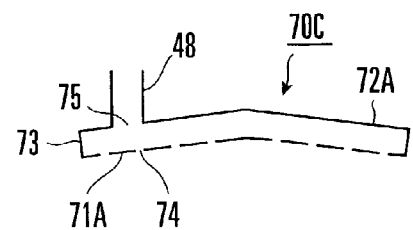

A cavity antenna 70C shown in FIG. 14(b) is formed by arranging parallel to each other first and second conductive plates 71A and 72A forming upward convex circular conical surfaces, and corresponds to the radial antenna 30C shown in FIG. 9(a).

Figure 14C:
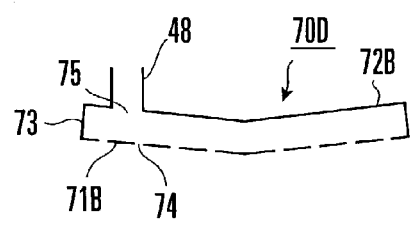

A cavity antenna 70D shown in FIG. 14(c) is formed by arranging parallel to each other first and second conductive plates 71B and 72B forming downward convex circular conical surfaces, and corresponds to the radial antenna 30D shown in FIG. 9(b).

Figure 14D:
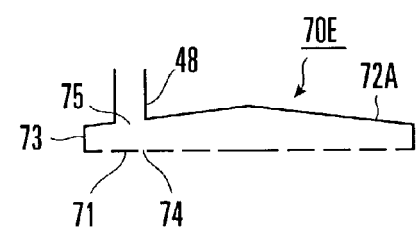

A cavity antenna 70E shown in FIG. 14(d) uses a flat plate-like conductive plate 71 as the first conductive plate and a conductive plate 72A forming an upward convex circular conical surface as the second conductive plate, and corresponds to the radial antenna 30E shown in FIG. 10(a).

Figure 14E:
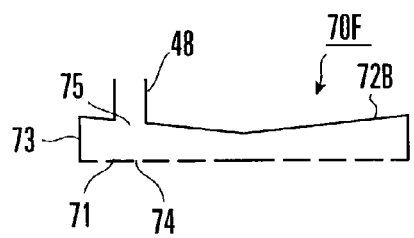

A cavity antenna 70F shown in FIG. 14(e) similarly uses a flat plate-like conductive plate 71 and a conductive plate 72B forming a downward convex circular conical surface as the second conductive plate, and corresponds to the radial antenna 30E shown in FIG. 10(b).

Fourth Embodiment

Figure 15:
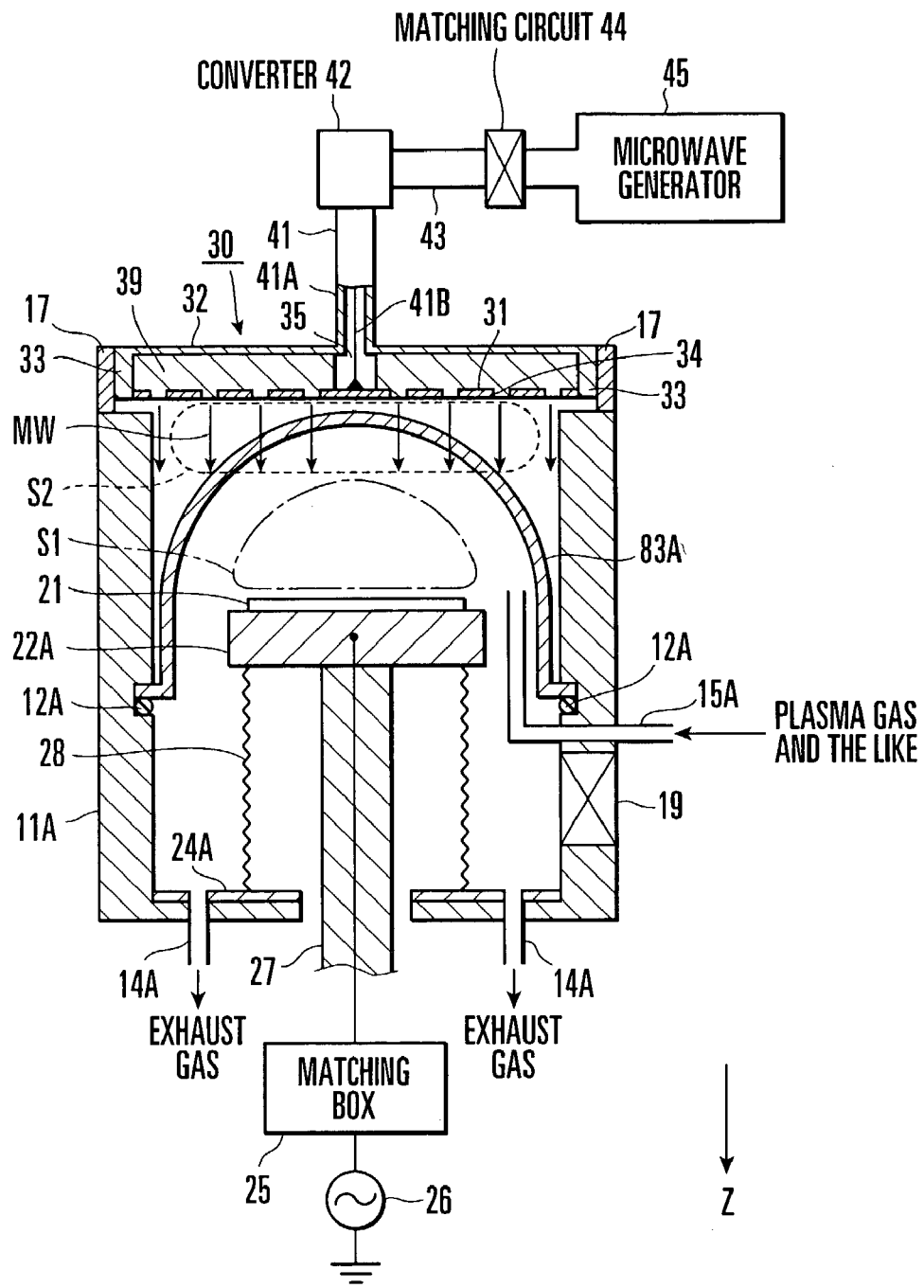
FIG. 15 is a view showing the arrangement of an etching apparatus according to the fourth embodiment of the present invention.

FIG. 15 is a view showing the arrangement of an etching apparatus according to the fourth embodiment of the present invention. In FIG. 15, the same portions as in FIG. 1 are denoted by the same reference numerals, and a description thereof will be omitted when necessary.

This etching apparatus has, in place of the dome-like dielectric plate 13A, a semispherical or bowl-like bell jar (first dielectric member) 83A which covers a substrate 21 located at a processing position. More specifically, the semispherical or bowl-like bell jar 83A is placed on the processing position from above with its opening facing down, and the edge of the opening of the bell jar 83A is fixed to the side wall of a processing vessel 11A below the processing position. Therefore, the side wall of the processing vessel 11A close to a space where a plasma is present with a comparatively high density is isolated from a susceptor 22A by the bell jar 83A. The bell jar 83A is made of a dielectric such as silica glass or ceramic material (e.g., $Al_2O_3$ or AlN) with a thickness of about 3 mm to 30 mm. A seal member 12A such as an O-ring is interposed at the bonding portion between the processing vessel 11A and bell jar 83A.

The susceptor 22A on which the substrate 21 is to be placed is supported by an elevating shaft 27 loosely extending through the bottom of the processing vessel 11A, so that it can move vertically. When loading or unloading the substrate through a loading/unloading port 19, the susceptor 22A is moved downward. When performing an etching process, the susceptor 22A is moved upward so the substrate 21 can be located at the processing position.

An insulating plate 24A made of a ceramic material or the like is formed on the bottom of the processing vessel 11A. In order to ensure the hermeticity of the processing vessel formed of the processing vessel 11A and bell jar 83A, a bellows 28 is provided between the susceptor 22A and insulating plate 24A to surround the elevating shaft 27.

Exhaust ports 14A connected to a vacuum pump (not shown) are formed in the bottom of the processing vessel 11A, and a nozzle 15A for introducing a process gas and etching gas into the processing vessel is formed in the side wall of the processing vessel 11A. The nozzle 15A extends above the processing position of the substrate 21, so that the gas is discharged into the space above the susceptor 22A.

As described above, the bell jar 83A forms a semispherical or bowl-like shape, and accordingly has a surface inclining with respect to the radiation surface (conductive plate 31) of a radial antenna 30. As a result, a plasma distribution better than the conventional one can be obtained, in the same manner as in the case of the etching apparatus shown in FIG. 11.

In a region close to a space including a plasma generating space S1 and where the plasma is present at a comparatively high density, since the side wall of the processing vessel 11A is covered by the bell jar 83A, contamination of the interior of the processing vessel which is caused when the generated plasma comes into contact with the side wall of the processing vessel 11A to sputter the metal surface can be suppressed.

Figure 16A:
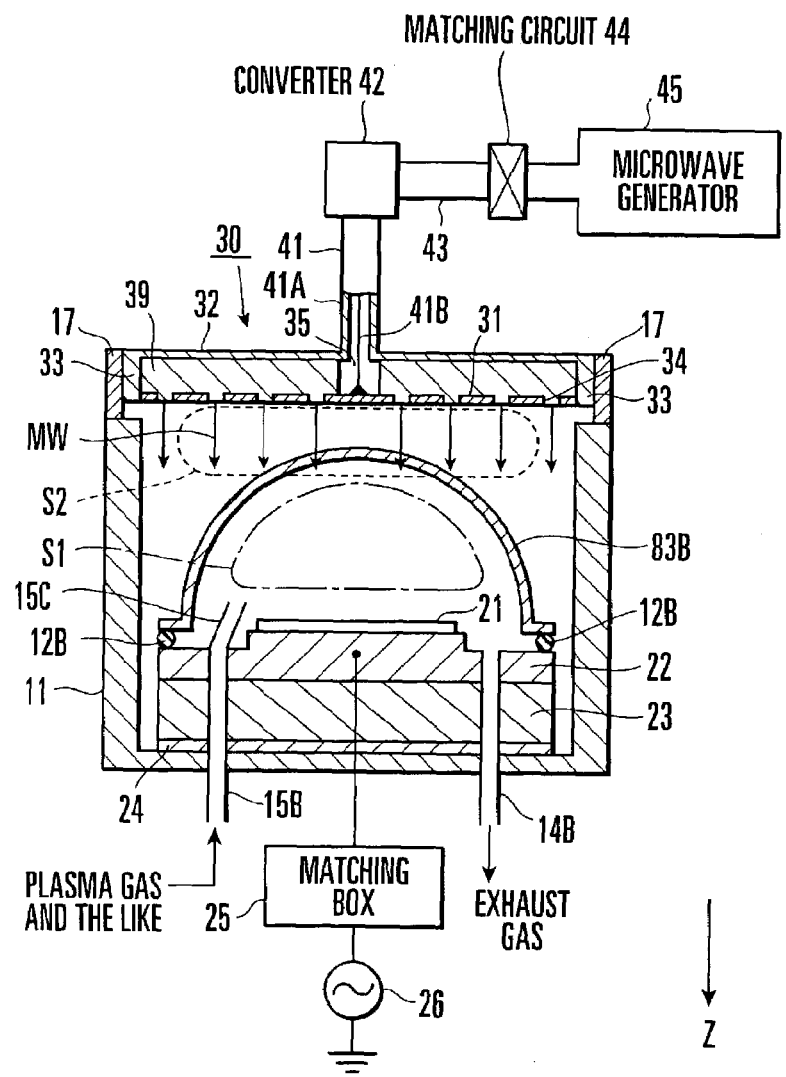
FIG. 16 includes views showing the arrangement of a modification of the etching apparatus shown in FIG. 15.
Figure 16B:
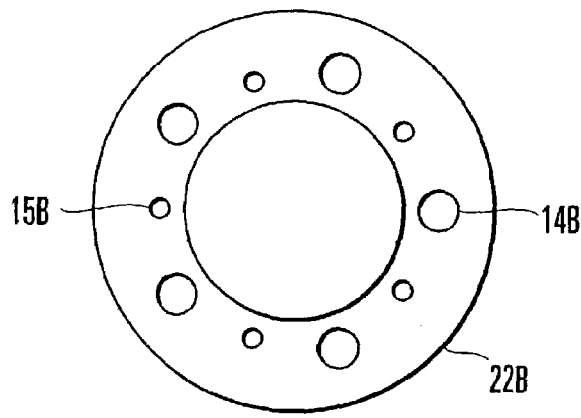

FIG. 16 includes views showing a modification of the etching apparatus shown in FIG. 15, in which FIG. 16(a) is a sectional view, and FIG. 16(b) is a plan view of a susceptor 22. In FIG. 16, the same portions as in FIG. 11 are denoted by the same reference numerals, and a description thereof will be omitted when necessary.

As shown in FIG. 16(a), a semispherical or bowl-like bell jar (first dielectric member) 83B may be arranged on the upper surface of the susceptor 22. In this case, the susceptor 22 sealed by a seal material 12B and the bell jar 83B form the processing vessel. An exhaust through hole 14B and gas inlet through hole 15B are formed in each of the susceptor 22, a support table 23, an insulating plate 24, and the bottom of a processing vessel 11. As shown in FIG. 16(b), the through holes 14B and 15B are formed in the peripheries of the susceptor 22 and the like. A guide 15C shown in FIG. 16(a) may be attached to the gas inlet through hole 15B, so the gas introduced from the through hole 15B will not be directly exhausted from the adjacent through hole 14B.

In this manner, when the upper surface of the susceptor 22 is covered with the bell jar 83B, the upper surface of the susceptor 22 is completely isolated from the metal surface of the processing vessel 11. This can suppress the contamination described above more effectively.

Fifth Embodiment

Figure 17:
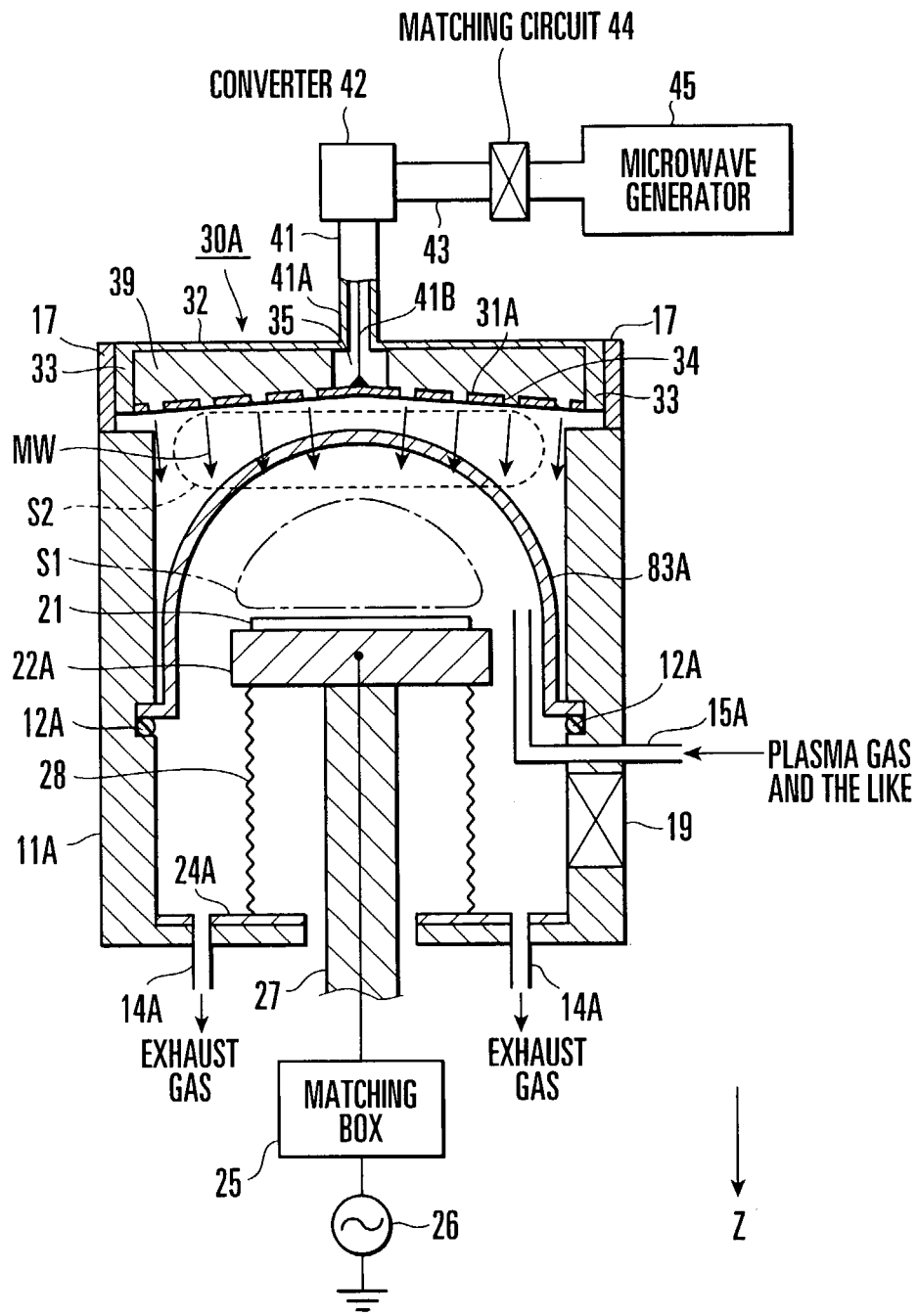
FIG. 17 is a view showing the arrangement of an etching apparatus according to the fifth embodiment of the present invention.

FIG. 17 shows the arrangement of an etching apparatus according to the fifth embodiment of the present invention. In FIG. 17, the same portions as in FIGS. 1 and 15 are denoted by the same reference numerals, and a description thereof will be omitted when necessary.

This etching apparatus is formed by combining a radial antenna 30A having a circular conical radiation surface and a semispherical or bowl-like bell jar 83A. When a change in radiation angle of a microwave MW depending on the antenna shape and a change in angle of the plasma plane depending on the bell jar shape act with each other, the planar distribution of the efficiency with which the microwave MW is absorbed by the plasma can be adjusted.

Figure 18:
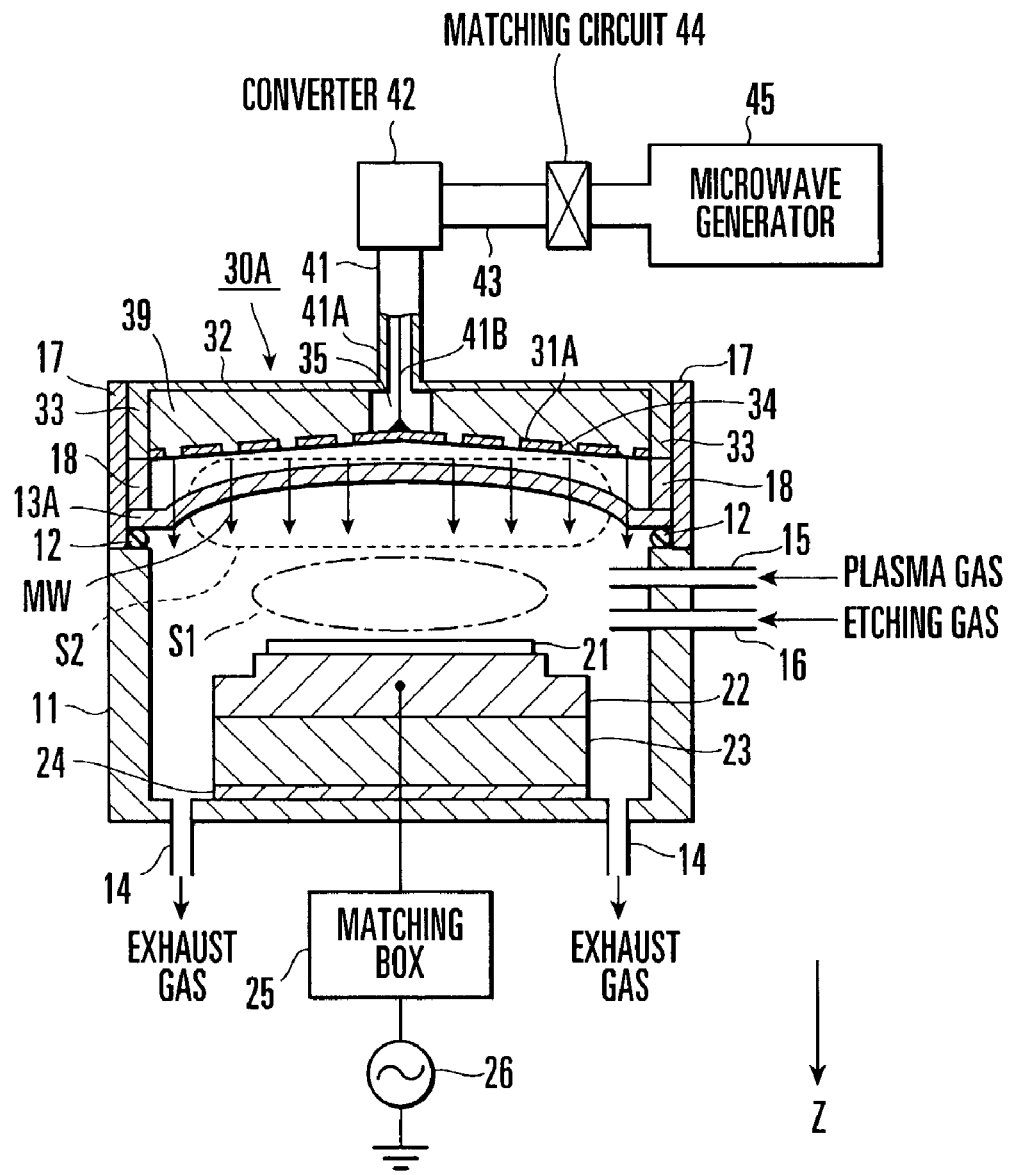
FIG. 18 is a view showing the arrangement of a modification of the etching apparatus shown in FIG. 17.

As shown in FIG. 18, when a radial antenna 30A having a circular conical radiation surface and a dome-like dielectric plate 13A are combined, the same operation and effect can be obtained.

The combination of the antenna and bell jar or dielectric plate is not limited to the described one, but any combination of any one of the radial antennas 30A to 30F and the bell jar 83A or 83B or dielectric plate 13A can be used.

Sixth Embodiment

Figure 19:
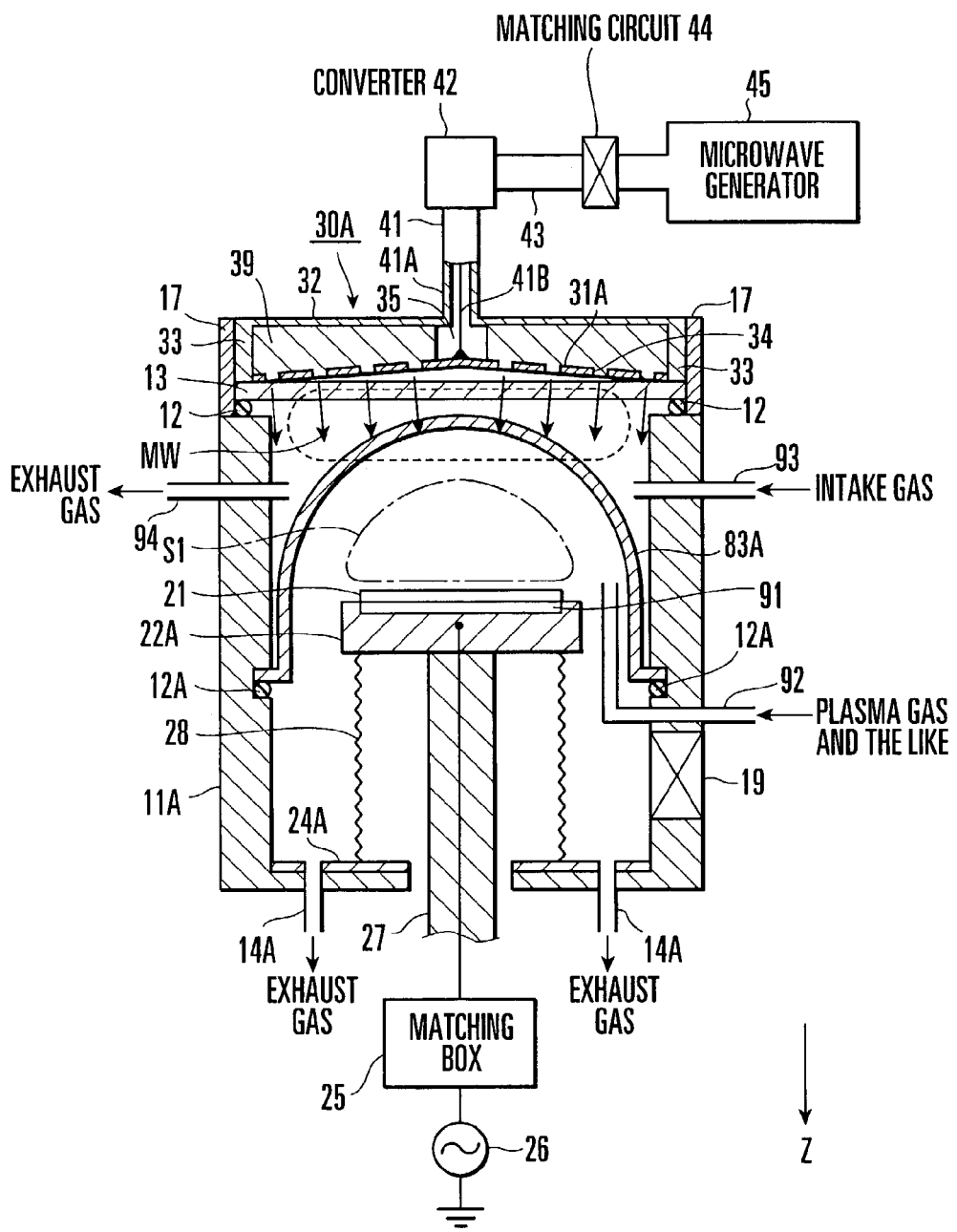
FIG. 19 is a view showing the arrangement of a CVD apparatus according to the sixth embodiment of the present invention.

In the above description, the present invention is applied to etching apparatuses. The present invention can also be applied to other plasma processing apparatuses such as a plasma CVD (chemical vapor deposition) apparatus. A case wherein the present invention is applied to a CVD apparatus will be described. FIG. 19 shows the arrangement of a CVD apparatus according to the sixth embodiment of the present invention. In FIG. 19, the same portions as in FIG. 17 are denoted by the same reference numerals, and a description thereof will be omitted when necessary.

This CVD apparatus has a heater 91 for heating a substrate 21, a gas supply nozzle 92 for introducing a gas mixture of $SiH_4$ and $H_2$ into the processing vessel, and the like, which are an arrangement necessary as an CVD apparatus, and also has a radial antenna 30A with a circular conical radiation surface, and a semispherical or bowl-like bell jar (first dielectric member) 83A for covering the substrate 21 located at the processing position. Thus, this CVD apparatus has the same characteristic features as those of the etching apparatus shown in FIG. 16.

In this CVD apparatus, the upper opening of a processing vessel 11A is sealed by a dielectric plate (second dielectric member) 13. A nozzle 93 and exhaust port 94 are formed as communication means in the side wall of the processing vessel 11A, so that a gas at a predetermined temperature is supplied to the sealed space surrounded by the bell jar 83A, dielectric plate 13, and processing vessel 11A, thus adjusting the temperature of the bell jar 83A. As the gas to be introduced from the nozzle 93, for example, $N_2$ is used as a gas that does not absorb a microwave MW easily. The temperature of this gas is set to a temperature higher than that of the bell jar 83A, and its upper limit is set to 600° C.

The operation of the CVD apparatus shown in FIG. 19 will be described.

First, the heater 91 is set to about 150° C. to heat the substrate 21, and a gas mixture of $SiH_4$ and $H_2$ is introduced into the processing vessel from the gas supply nozzle 92. When the microwave MW is supplied into the processing vessel from the radial antenna 30A, $SiH_4$ dissociates to form $SiH_x$ (x=1, 2, 3, 4). $SiH_x$ reacts with the surface of the substrate 21 to form an amorphous Si (to be abbreviated as a-Si hereinafter) film. At this time, if the bell jar 83A is at room temperature, $SiH_x$ attaches to the inner surface of the bell jar 83A to form an a-Si film. This a-Si interferes with the microwave MW from being introduced from the radial antenna 30A. However, since $N_2$ at a temperature of 600° C. or less, e.g., 150° C. to 300° C., is supplied into the space between the bell jar 83A and dielectric plate 13 so as to heat the bell jar 83A, $SiH_x$ does not attach easily. Therefore, formation of the a-Si film on the inner surface of the bell jar 83A can be reduced. As a result, loss of the microwave MW introduced into the processing vessel through the bell jar 83A is reduced, and a plasma is generated efficiently to form a film.

The fluid to be supplied into the sealed space surrounded by the bell jar 83A, dielectric plate 13, and processing vessel 11A need not be a gas but may be a liquid. In this case, a liquid that does not absorb the microwave MW easily, e.g., galden (perfluoropolyether) or fluoricate, is preferably used.

Alternatively, a fluid with a temperature lower than the above temperature may be supplied into the sealed space to cool the bell jar 83A. If the temperature of the bell jar 83A becomes excessively high due to the function of the microwave MW, the bell jar 83A may be broken. In the etching apparatus shown in FIG. 16, the resist on the substrate 21 may be sometimes burned by the radiation heat of the bell jar 83A, and a desired pattern cannot be etched. If the bell jar 83A is cooled in the above manner, this problem can be avoided.

The second dielectric member which forms the sealed space together with the bell jar 83A may be arranged on a side different from a susceptor 22A with respect to the bell jar 83A. Hence, the second dielectric member may be filled midway along a coaxial cable 41 as the feeder of the radial antenna 30A, thus forming a sealed space. In this case, the fluid is supplied into the radial antenna 30A as well.

In the fifth and sixth embodiments, a radial antenna is used as the slot antenna. When the cavity antenna shown in FIGS. 12 to 14 is used as well, the same effect can be obtained.

As has been described above, in the plasma processing apparatus according to the present invention, at least one of the first and second conductive plates that form a slot antenna inclines relative to the first dielectric member opposed to the first dielectric plate. When the first conductive plate constituting the radiation surface inclines with respect to the first dielectric member, plasma generation by the electric field of the electromagnetic field which enters directly from the slot antenna can be set dominant over plasma generation by the electric field of the standing wave formed in the processing vessel. Since the space between the first conductive plate and plasma plane deforms, the standing wave mode changes. When the first conductive plate inclines with respect to the second conductive plate, the distribution of the characteristic impedance of the antenna is adjusted, so that the distribution of the radiation amount of the antenna is adjusted. These functions cooperate to improve the plasma distribution over the conventional one.

The plasma processing apparatus according to the present invention can be applied to processing apparatuses such as an etching apparatus, CVD apparatus, and ashing apparatus.

The invention claimed is:

1. A plasma processing apparatus comprising a susceptor having a surface for placing a target object, wherein said surface of the susceptor is planar,
    a processing vessel in which said susceptor is arranged,
    a slot antenna opposed to said susceptor to supply an electromagnetic field into said processing vessel, and
    a first dielectric member opposed to a radiation surface of said slot antenna, wherein said first dielectric member is parallel with said surface of the susceptor,
    characterized in that said slot antenna comprises
        a first conductive plate constituting said radiation surface, wherein said first conductive plate is nonparallel with said surface of the susceptor,
        a second conductive plate arranged on a side opposite to said susceptor when seen from said first conductive plate, wherein said second conductive plate is parallel with said surface of the susceptor,
        an inlet port formed at a central part of said second conductive plate for introducing said electromagnetic field into a space between said first conductive plate and second conductive plate, and
        a plurality of slots formed in said first conductive plate so that said electromagnetic field introduced from said inlet port propagates from a central part of said space to a peripheral part and leaks out gradually in said processing vessel.

2. A plasma processing apparatus according to claim 1, characterized in that said first and second conductive plates of said slot antenna, and said first dielectric member are symmetrical with respect to a common central axis.

3. A plasma processing apparatus according to claim 1, characterized in that said first conductive plate of said slot antenna has an upward convex shape.

4. A plasma processing apparatus according to claim 1, characterized in that said first conductive plate of said slot antenna has a downward convex shape.

5. A plasma processing apparatus according to claim 1, characterized in that a gap between said first and second conductive plates is not less than 5 mm and less than λAg/2 where λg (λg>10 mm) is the wavelength of an electromagnetic field between said first and second conductive plates.

6. A plasma processing apparatus according to claim 1, characterized in that said first dielectric member has a flat plate-like shape.

7. A plasma processing apparatus according to claim 1, characterized in that a gap between said first conductive plate and said second conductive plate becomes short from the central part of said second conductive plate toward the peripheral part.

8. A plasma processing apparatus according to claim 1, characterized in that a gap between said first conductive plate and said second conductive plate becomes long from the central part of said second conductive plate toward the peripheral part.

9. A plasma processing apparatus according to claim 1, characterized in that
    said first dielectric member has a flat plate-like shape,
    said first conductive plate inclines with respect to said first dielectric member, the radiation direction of said electromagnetic field supplied from said slot antenna to the inside of said processing vessel inclines with respect to the direction of the normal to said first dielectric member.

10. A plasma processing apparatus according to claim 9, characterized in that a member for changing the angle of inclination of said first conductive plate with respect to said first dielectric member is further provided.

11. A plasma processing apparatus according to claim 1, characterized in that said first dielectric member has a flat plate-like shape.

12. A plasma processing apparatus comprising a susceptor for placing a target object, a processing vessel in which said susceptor is arranged, a slot antenna opposed to said susceptor to supply an electromagnetic field into said processing vessel, and a first dielectric member opposed to a radiation surface of said slot antenna, wherein said first dielectric member is parallel with a surface of the susceptor, characterized in that said slot antenna comprises a first conductive plate constituting said radiation surface, wherein said first conductive plate is nonparallel with said surface of the susceptor, a second conductive plate arranged on a side opposite to said susceptor when seen from said first conductive plate, wherein said first and second conductive plates are nonparallel relative to one another, and said second conductive plate is parallel with said surface of the susceptor an inlet port formed at a central part of said second conductive plate for introducing said electromagnetic field into a space between said first conductive plate and second conductive plate, and a plurality of slots formed in said first conductive plate.

13. A plasma processing apparatus according to claim 12, characterized in that said first and second conductive plates of said slot antenna, and said first dielectric member are symmetrical with respect to a common central axis.

14. A plasma processing apparatus according to claim 12, characterized in that said first conductive plate of said slot antenna has an upward convex shape.

15. A plasma processing apparatus according to claim 12, characterized in that said first conductive plate of said slot antenna has a downward convex shape.

16. A plasma processing apparatus according to claim 12, characterized in that a gap between said first and second conductive plates is not less than 5 mm and less than $\lambda g/2$ where $\lambda g$ ($\lambda g > 10$ mm) is the wavelength of an electromagnetic field between said first and second conductive plates.

17. A plasma processing apparatus according to claim 12, characterized in that said first dielectric member has a flat plate-like shape, said first conductive plate inclines with respect to said first dielectric member, the radiation direction of said electromagnetic field supplied from said slot antenna to the inside of said processing vessel inclines with respect to the direction of the normal to said first dielectric member.

* * * * *